United States Patent [19]

Hsu et al.

[11] Patent Number: 5,728,613
[45] Date of Patent: Mar. 17, 1998

[54] METHOD OF USING AN INSULATOR SPACER TO FORM A NARROW BASE WIDTH LATERAL BIPOLAR JUNCTION TRANSISTOR

[75] Inventors: Ching-Hsiang Hsu; Steve S. Chung, both of Hsin-chu; Shyh-Chyi Wong, Taichung; Mong-Song Liang, Hsin-chu, all of Taiwan

[73] Assignee: Taiwan Semiconductor Manufacturing Company, Ltd., Hsin-chu, Taiwan

[21] Appl. No.: 622,791

[22] Filed: Mar. 27, 1996

[51] Int. Cl.⁶ ............... H01L 21/8238; H01L 21/331; H01L 21/8222
[52] U.S. Cl. .......................... 438/204; 438/316
[58] Field of Search ................. 437/21, 27, 32, 437/59; 438/202, 203, 204, 316

[56] References Cited

U.S. PATENT DOCUMENTS

| | | | |
|---|---|---|---|
| 4,997,782 | 3/1991 | Bergonzoni | 437/27 |
| 5,258,318 | 11/1993 | Buti et al. | 437/34 |
| 5,610,087 | 3/1997 | Hsu et al. | 437/59 |

*Primary Examiner*—Brian Dutton
*Attorney, Agent, or Firm*—George O. Saile; Stephen B. Ackerman

[57] ABSTRACT

A process has been developed in which narrow base width, lateral bipolar junction transistors, and narrow channel length MOSFET devices, can be simultaneously fabricated, in a silicon on insulator layer. The narrow base width is defined by the width of an insulator sidewall spacer, formed on the sides of a polysilicon gate structure. The narrow base width, resulting in increased transistor gain and switching speed, along with reductions in parasitic capacitances, due to placing devices in a silicon on insulator layer, result in enhanced device performance.

22 Claims, 7 Drawing Sheets

FIG. 9

METHOD OF USING AN INSULATOR SPACER TO FORM A NARROW BASE WIDTH LATERAL BIPOLAR JUNCTION TRANSISTOR

BACKGROUND OF THE INVENTION (1) Field of the Invention

This invention relates to the fabrication of a semiconductor device, and more specifically to semiconductor devices fabricated from silicon on insulator, (SOI), technology.

(2) Description of Prior Art

A major objective of the semiconductor industry has been to increase the performance of silicon devices while still maintaining, or decreasing the cost of manufacturing silicon devices or chips. These objectives are being partially realized by the ability of the semiconductor industry to achieve micro-miniaturization. The ability to produce silicon devices, with sub-micron features, has resulted in faster performing, and less costly silicon chips. Performance increases have been realized via decreased parasitic capacitances, and decreased resistances, as a result of the smaller device features. In addition smaller features, resulting in smaller silicon chips, allow more chips to be obtained from a specific diameter starting silicon wafer. Therefore for the identical cost of processing a wafer, a greater number of chips can be realized. Micro-miniaturazation has been achieved basically by rapid advances in several critical semiconductor fabrication disciplines. For example in the photolithographic discipline, more sophisticated exposure cameras, as well as more sensitive photoresist materials, have allowed sub-micron images in photoresist to be routinely achieved. In addition similar advances in the dry etching sector have allowed the sub-micron images in photoresist to be successfully transferred to underlying semiconductor materials, used in the fabrication sequence for semiconductor devices. However the approach of continually improving device performance via micro-miniaturazation, can be ultimately limited by the inability of the semiconductor fabrication disciplines to continue their rapid development of tools and materials.

Another approach used to increase device performance, via reductions in parasitic capacitances, is by the silicon on insulator, (SOI), technology. In this technology a thin layer of single crystalline silicon resides on an insulator, which in turn resides on a silicon substrate. The active device regions are created within the SOI layer, therefore unwanted junction capacitances, resulting in part from diffusion to substrate interfaces, are dramatically reduced. The advances in SOI technology have created opportunities for device designers, in regards to for both bipolar junction transistors, (BJT), as well as for metal oxide semiconductor field effect transistors, (MOSFET), devices. In addition semiconductor process sequences can be easily established, via use of the SOI technology, to integrate the BJT and MOSFET processes, to easily create a BiCMOS, (BJT-MOSFET), device. Prior art, such as Buti, et al, in U.S. Pat. No. 5,258,318, has described a method for fabricated integrated circuits using SOI. However that inventions does not show the specific techniques used to produce competitive, or high performing, BJT devices, that this present invention will teach. This invention will describe a process sequence for fabricating lateral, NPN bipolar junction devices, using SOI technology, with optimized device parameters, such as transistor gain, beta, as well as transistor switching speeds. It will be shown that the process sequences used to achieve this competitive BJT can also be used to simultaneously create MOSFET devices, thus offering a BiCMOS option.

SUMMARY OF THE INVENTION

It is an object of this invention to fabricate both bipolar junction transistors, as well as MOSFET devices, in a SOI layer.

It is another object of this invention to provide a process sequence which allows a lateral, NPN bipolar junction transistor to be easily fabricated using process steps, similar to process steps used to create a P channel MOSFET device.

It is yet another object of this invention to provide both lateral, NPN bipolar junction transistors and P channel MOSFET devices with small parasitic capacitances, due to the use of SOI technology.

It is still yet another object of this invention to use an insulator sidewall spacer, created on the sides of a polysilicon gate structure, to define the base width of the lateral, NPN bipolar junction transistor.

In accordance with the present invention a P type, single crystalline silicon layer, is present on a silicon oxide layer, which in turn overlies a semiconductor substrate. An N well region is created by ion implantation, and drive in of a N type dopant, to create the foundation for both a subsequent lateral, NPN bipolar junction transistor, as well as a P channel, MOSFET device. Thick field oxide regions are thermally grown, for isolation purposes, followed by the growth of a thin silicon dioxide layer, to be used as the gate oxide for the MOSFET device. A polysilicon layer is chemically vapor deposited, doped via ion implantation procedures, and patterned to produce a polysilicon gate structure for the MOSFET device. A blanket P type, ion implantation procedure is used to create a base region for the lateral, NPN bipolar junction transistor, as well as a lightly doped source and drain region, for the MOSFET device. A photoresist masking pattern is next employed to allow the ion implantation of an N type dopant to be accomplished only in a area to be used as the collector region of the subsequent lateral, NPN bipolar junction transistor. Insulator sidewall spacers are next created on the sides of the polysilicon gate structures via deposition of, and anisotropic dry etching of, an insulator layer. The subsequent MOSFET device is again masked via photoresist processes, and a heavily doped N type, ion implantation procedure is applied to the region of the lateral bipolar junction transistor, not covered by the polysilicon gate structure, not covered by the insulator sidewall spacer, creating the emitter region, and defining the final base width of the bipolar device. After photoresist removal, and solvent cleans, another photoresist mask is used to allow a heavily doped P type, ion implantation procedure to be applied to regions of the MOSFET device, for purposes of creating source and drain areas, and to regions of the lateral bipolar junction transistor, for purposes of creating a contact area for the base region.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating a lateral, NPN bipolar junction transistor, with a narrow base width, via use of an insulator sidewall spacer, in addition to creating a P channel MOSFET device, both in an SOI layer, will now be described in detail.

Figure 1:
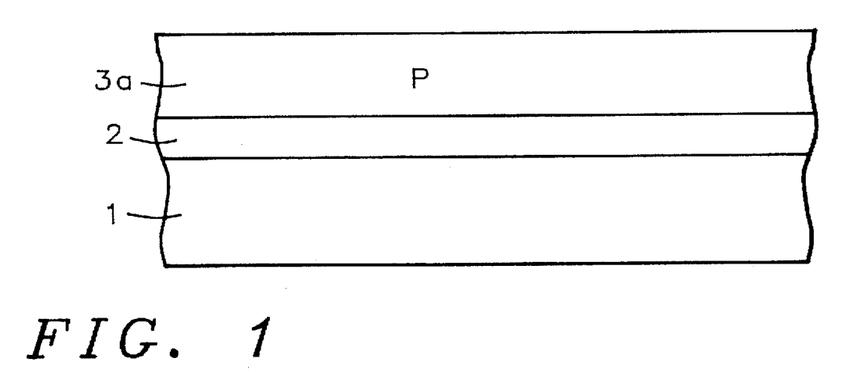
FIGS. 1–3, which schematically, in cross-sectional style, show the early stages of fabrication for both a lateral, NPN bipolar junction transistor, and a P channel, MOSFET device, in an SOI layer.

FIG. 1, shows a starting substrate, 1, with a silicon oxide layer, 2, and an overlying silicon on insulator layer, 3a. The method used to obtain the silicon on insulator, (SOI), layer, is the SIMOX process, (Separation by IMplanted OXygen). This process results in a silicon on oxide layer, 3a, consisting of P type silicon, with a <100> crystallographic orientation, to a thickness between about 1000 to 2000 Angstroms, and a resistivity between about 15 to 25 ohm-cm. The defect density of SOI layer, 3a, is less than about 1E4 defects/$cm^2$. The underlying silicon oxide layer is between about 750 to 1250 Angstroms.

Figure 2:
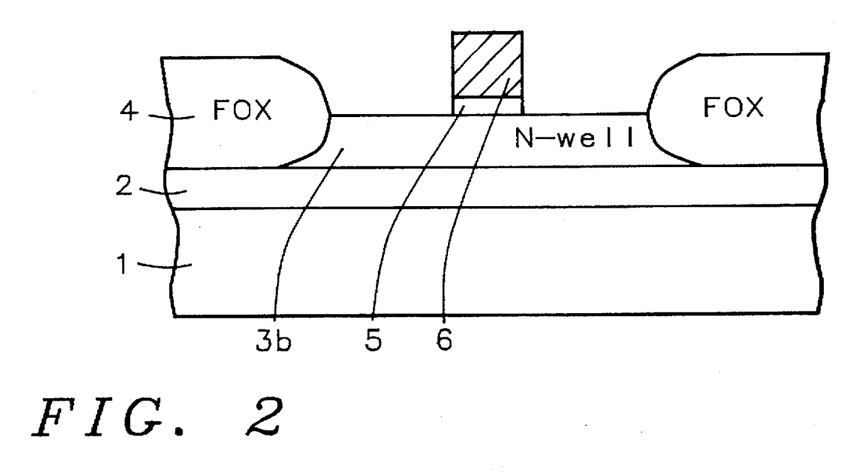

An N well region, 3b, is next created by subjecting the P type silicon layer, 3a, to an ion implantation of phosphorous, or arsenic at an energy between about 50 to 100 Kev., at a dose between about 5E11 to 5E13 atoms/$cm^2$. FIG. 2, next describes the creation of a thick, isolation, field oxide region, 4, (FOX), thermally grown using a silicon nitride-silicon dioxide composite, oxidation mask. The composite mask is patterned using standard photolithographic and reactive ion etching, (RIE), procedures. The FOX regions, 4, are thermally grown, in unmasked areas, using an oxygen-steam ambient, to a thickness between about 2000 to 6000 Angstroms, at a temperature between about 900 to 1150° C. The thickness of the FOX region, 4, is designed to consume the entire thickness of the SOI layer, 3b, in the areas not masked by the composite silicon nitride-silicon dioxide oxidation mask, to provide the required isolation. After removal of the oxidation mask composite, using hot phosphoric acid for silicon nitride, and a buffered hydrofluoric acid for the underlying silicon oxide layer, a thin silicon dioxide layer, 5, is thermally grown at a temperature between about 800° to 1000° C., to a thickness between about 40 to 200 Angstroms. The silicon dioxide layer, 5, will be used as the gate insulator for the subsequent MOSFET device. A polysilicon film is next deposited using low pressure chemical vapor deposition, (LPCVD), processing, at a temperature between about 600° to 650° C., to a thickness between about 1200 to 3000 Angstroms. The polysilicon layer can be deposited intrinsically and doped via ion implantation of phosphorous, at an energy between about 50 to 100 Kev., at a dose between about 1E14 to 1E16 atoms/$cm^2$. The polysilicon film can also be deposited using insitu doping procedures which include the addition of either phosphine or arsine to the silane ambient. Standard photolithographic and RIE procedures, using $Cl_2$ as an enchant, are employed to create polysilicon structure, 6, shown schematically in FIG. 2. The width of polysilicon structure, 6, between about 0.1 to 1.0 micrometers, will ultimately determine the channel length for the subsequent MOSFET device, and the N type collector region, for the lateral bipolar junction transistor.

Figure 3:
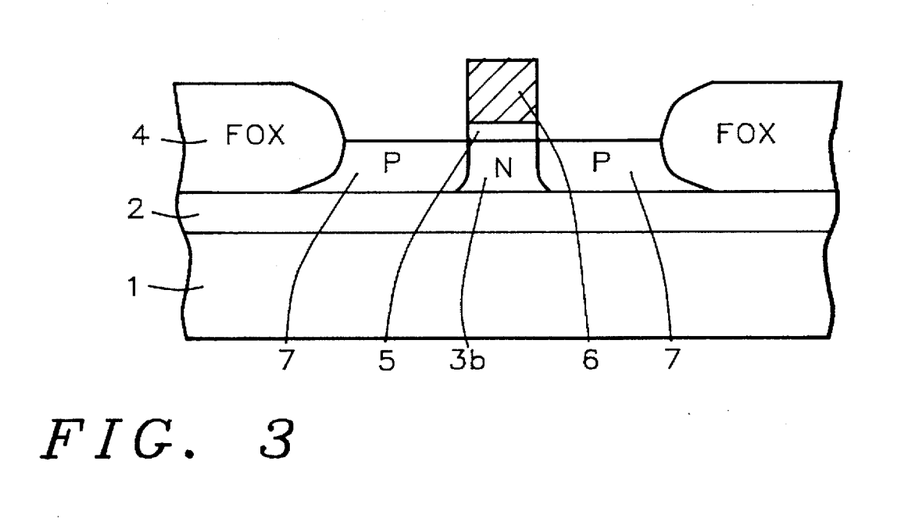

FIG. 3, shows the creation of a P type region, 7, to be used for the base region of the lateral, NPN bipolar junction transistor, as well as used for the lightly doped source and drain region for the subsequent P channel MOSFET device. A blanket ion implantation of boron is performed at an energy between about 30 to 80 Kev., at a dose between about 1E12 to 1E14 atoms/$cm^2$, to create the P type region, 7. This implantation step also results in the final definition of collector region of the lateral, NPN bipolar junction transistor, as well as the channel length for the subsequent P channel, MOSFET device.

Figure 4A:
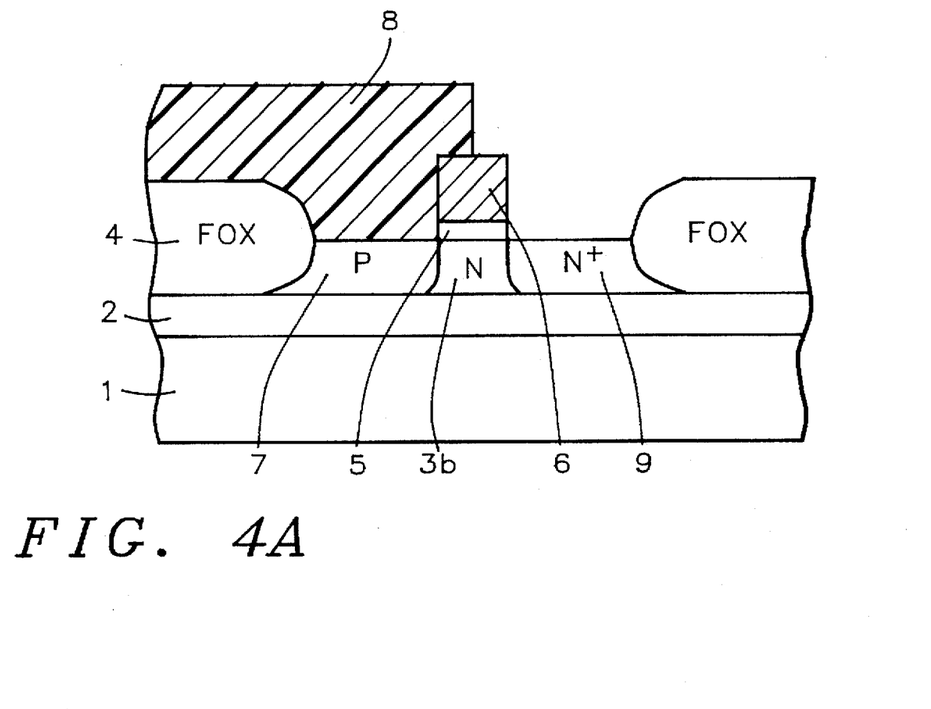
FIGS. 4a, 5a, 6a, 7a, 8a which schematically, in cross-sectional style, show the final stages of fabrication, used to create a lateral, NPN bipolar junction transistor, in an SOI layer.
Figure 4B:
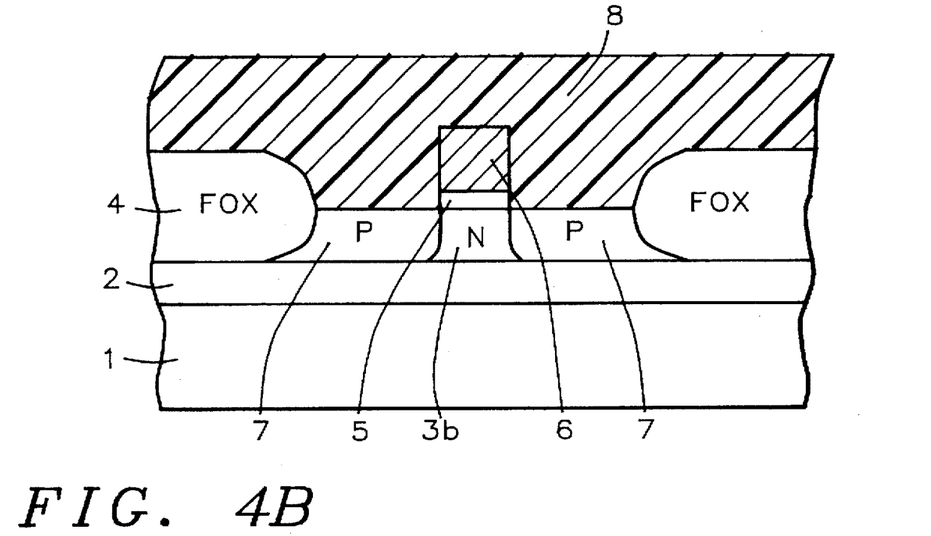
FIGS. 4b, 5b, 6b, 7b, which schematically, in cross sectional style, show the final stages of fabrication, used to create a P channel, MOSFET device, in an SOI layer.
Figure 5A:
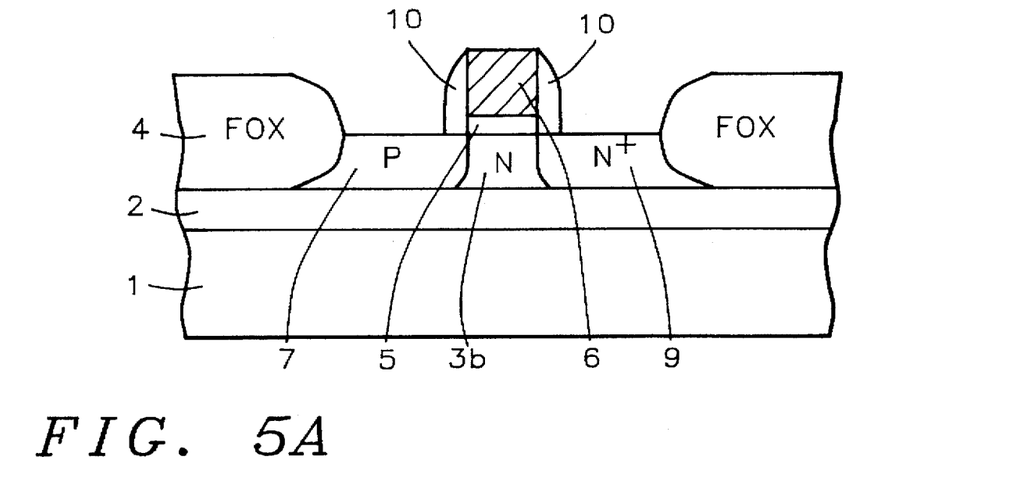
Figure 5B:
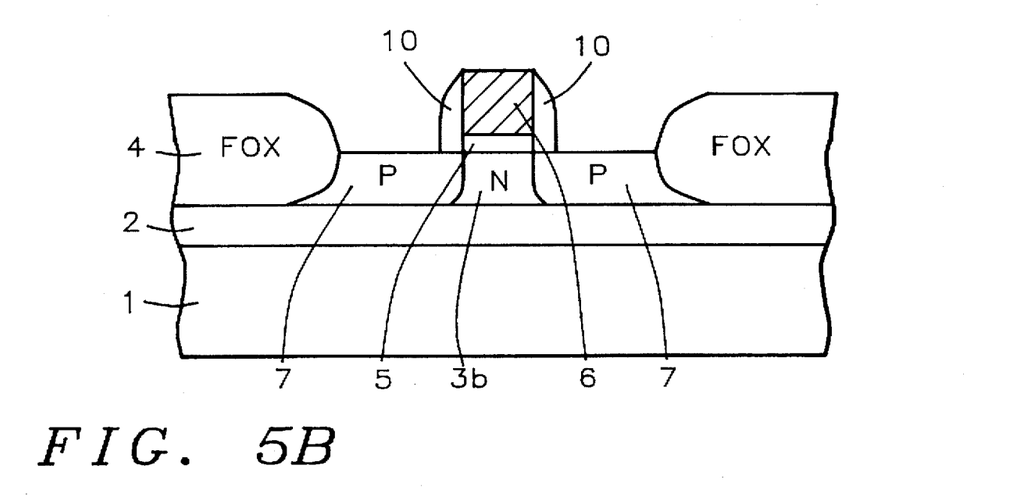

A photoresist shape, 8, is next formed, and shown schematically in FIG. 4a, and FIG. 4b. An arsenic ion implantation is performed, in regions not covered by photoresist shape, 8, at an energy between about 25 to 40 Kev., at a dose between about 5E14 to 5E15 atoms/$cm^2$, to create the heavily doped collector region, 9, to be used for contact purposes for the lateral, NPN bipolar junction transistor. The P channel MOSFET device, shown in FIG. 4b, was not subjected to this ion implantation step. After photoresist removal, via plasma oxygen ashing, followed by careful wet cleans, an insulator sidewall spacer, 10, is created for the lateral, NPN bipolar junction transistor, shown in FIG. 5a, as well as the P channel, MOSFET device, shown schematically in FIG. 5b. The insulator sidewall spacer, 10, shown in FIGS. 5a–5b, is created by initially depositing silicon oxide, using either LPCVD or plasma enhanced chemical vapor deposition, (PECVD), processing, at a temperature between about 600° to 800° C., to a thickness between about 800 to 2500 Angstroms. Next an anisotropic, RIE procedure, using $CHF_3$ as an etchant, is employed to create the spacer. The width of insulator sidewall spacer, 10, or thickness of the initial silicon oxide layer, will be critical in determining the final base width of the lateral, NPN bipolar junction transistor.

Figure 6A:
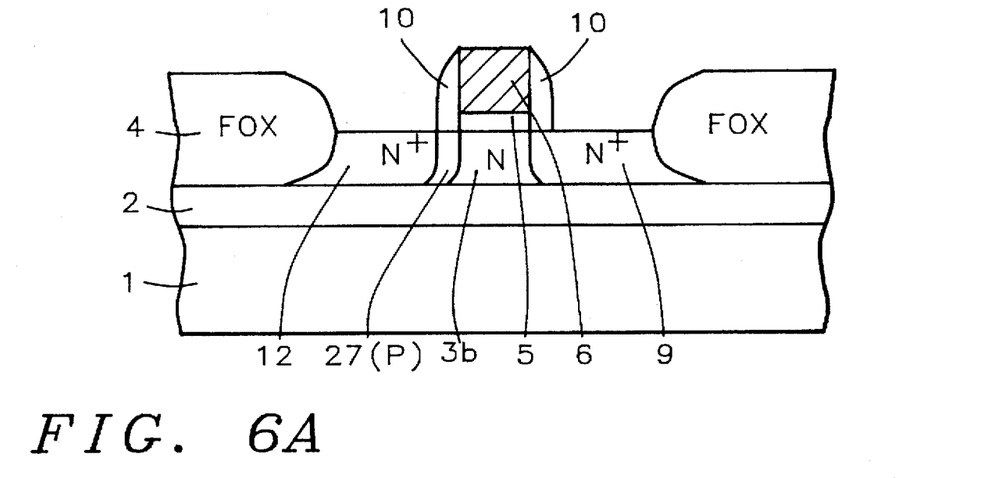
Figure 6B:
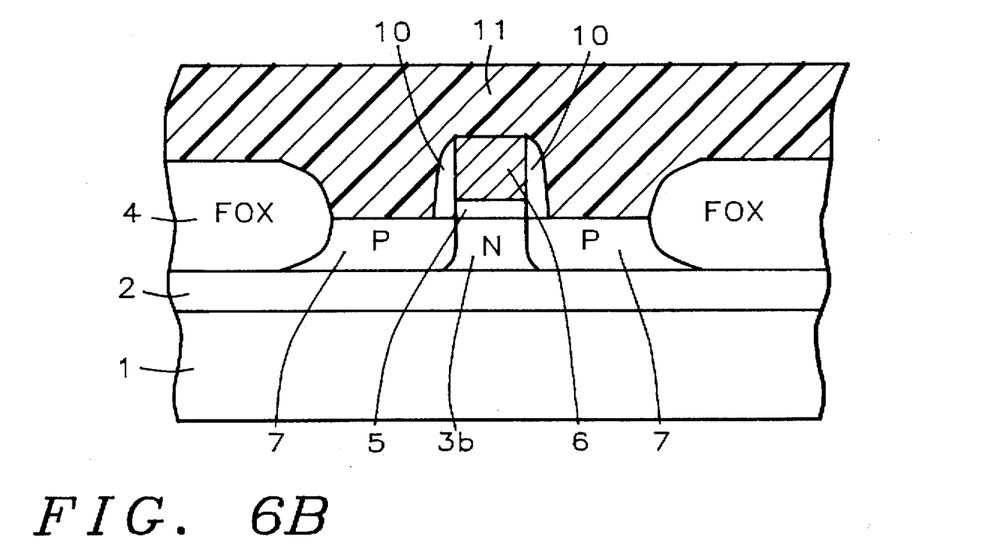

Photolithographic procedures are again used to block out the subsequent MOSFET device, using photoresist shape, 11, shown schematically in FIG. 6b. The unmasked lateral, NPN lateral bipolar transistor is then subjected to a ion implantation step, using arsenic at an energy between about 30 to 80 Kev., at a dose between about 5E14 to 5E15 atoms/$cm^2$, to create emitter region, 12, shown schematically in FIG. 6a. This implantation procedure also determines the final base width, 27, of the lateral, NPN bipolar junction transistor, as well as increasing the conductivity of the heavily doped collector region, 9. A major objective of this invention is to create competitive bipolar devices in terms of transistor gain, as well transistor switching speed. These transistor characteristics are positively influenced by decreasing base widths. Therefore the ability to create narrow insulator sidewall spacers translates into narrow base widths, resulting in enhanced device performance in terms of transistor gain, beta, as well as enhanced transistor switching speeds. The combination of creating fast bipolar junction transistors, along with the reduced parasitic capacitances, realized via the use of SOI technology, results in enhanced device performance.

Figure 7A:
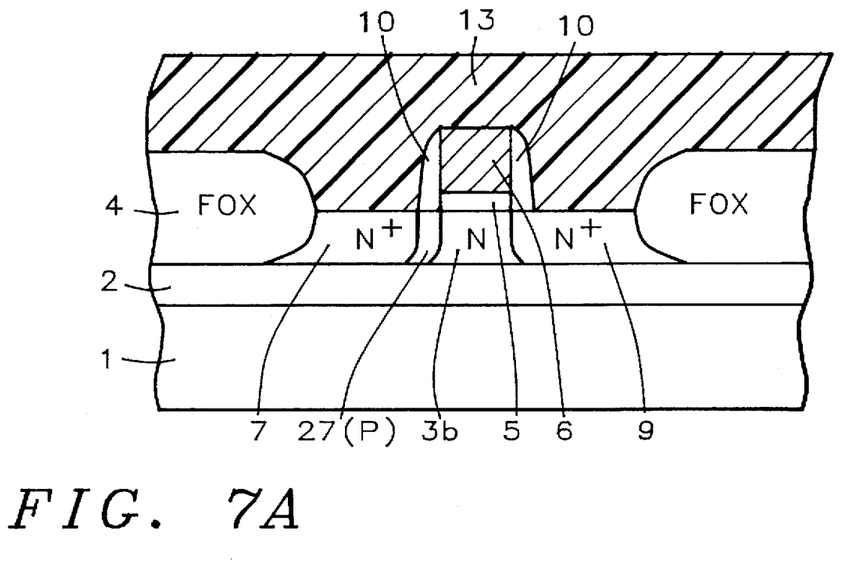
Figure 7B:
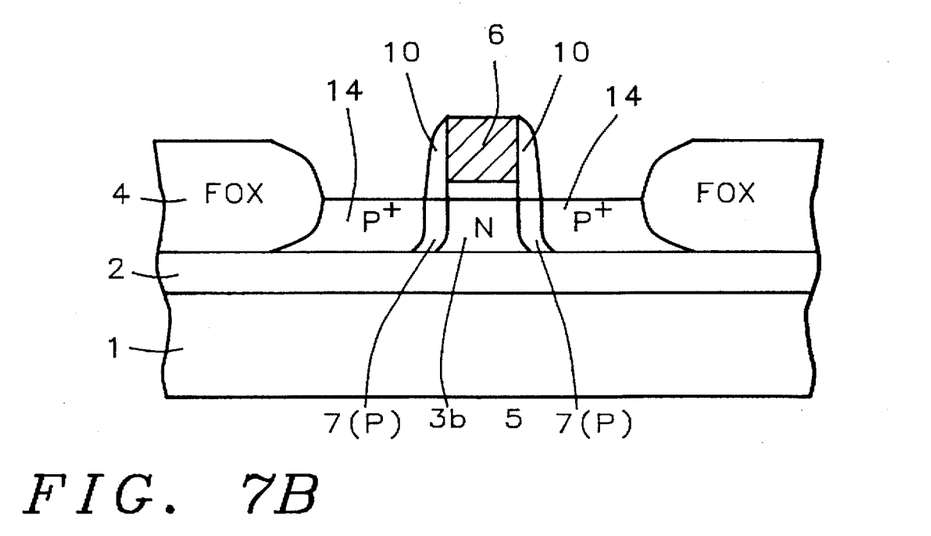

Removal of photoresist blockout mask, 11, is accomplished via plasma oxygen ashing, followed by careful wet solvent cleans. Another photoresist mask, 13, is used to allow a heavily doped, P type ion implantation of boron, at an energy between about 30 to 80 Kev., at a dose between about 1E14 to 5E15 atoms/$cm^2$, to be used to create the heavily doped, P type source and drain regions, 14, for the P channel MOSFET device. This is shown schematically in FIG. 7b. The photoresist mask, 13, is also used to allow a portion of the P type region, 7, to receive the heavily doped P type implantation, for purposes of improving base contact resistance to subsequent overlying metallizations. This is not shown in FIG. 7a.

Figure 8A:
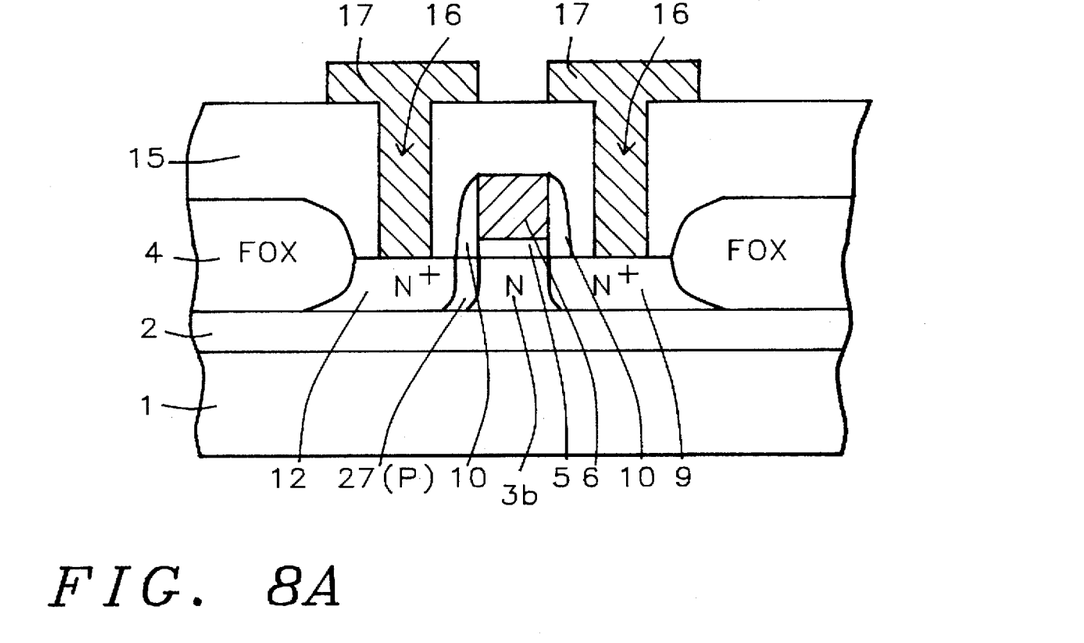

Photoresist mask, 13, is removed via plasma oxygen ashing, and careful wet solvent cleans, followed by the deposition of silicon oxide layer, 15, obtained using PECVD processing at a temperature between about 300° to 450° C., to a thickness between about 5000 to 7000 Angstroms. This is shown schematically in FIG. 8a. Standard photolithographic and RIE processing, using $CHF_3$ as an etchant, are used to open contact hole, 16, to the emitter region, 12, and contact hole, 16, to heavily doped collector region, 9. Contact holes to heavily doped, P region of the lateral, NPN, bipolar junction transistor, as well as contact holes to the P type source and drain region, 14, and to a polysilicon gate structure, 6, of the also one MOSFET device structure, are also opened in silicon oxide layer, 15, but not shown in FIG. 8a. After photoresist removal, via plasma oxygen ashing, followed by careful wet cleans, a deposition of an aluminum based metallurgy is made to a thickness between about 4000 to 6000 Angstroms. Again standard photolithographic and RIE procedures, using a $Cl_2$ etch chemistry, are used to produce metal structure, 17, shown schematically in FIG. 8a. Photoresist is again removed using plasma oxygen ashing processing, followed by careful wet solvent cleans.

Figure 9:
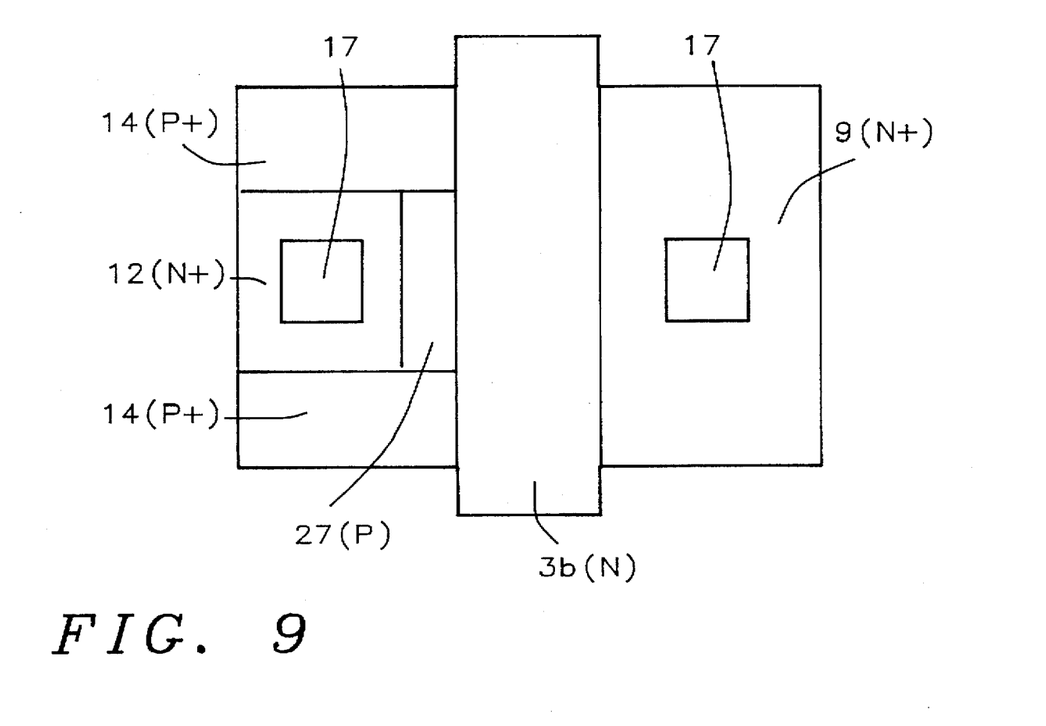
FIG. 9, which shows the top view of a lateral, NPN bipolar junction transistor, created in an SOI layer.

FIG. 9, shows a top view of the lateral, NPN bipolar junction transistor. Contact holes to heavily doped P type region, 14, are not shown. The top view clearly shows the narrow base region, 27, defined by the insulator space thickness, and by the creation of emitter region, 12.

Although this process for fabricating enhanced lateral, NPN bipolar junction transistors, along with P channel MOSFET devices, has been shown using a P channel MOSFET device, applications can be accommodated to easily include N channel MOSFET devices, to again achieve BiCMOS designs. This can be accomplished by not subjecting the SOI layer, to be used for the MOSFET device, to the N well processing. The collector, or emitter, N type ion implantation procedures could then be used to create N type source and drain regions, resulting in an N channel MOSFET device.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a first type silicon transistor, and a second type silicon transistor, in a layer of silicon on insulator, on a semiconductor substrate, comprising the steps of:

providing said semiconductor substrate;

providing said silicon on insulator layer, on said semiconductor substrate;

growing field oxide regions on specific areas of said silicon on insulator layer;

growing a first insulator layer on the surface of said silicon on insulator layer, not covered by said field oxide regions;

depositing a polysilicon layer on said first insulator layer, and on said field oxide regions;

ion implanting a first conductivity imparting dopant into said polysilicon layer;

patterning of said polysilicon layer to form first and second polysilicon gate structures;

ion implanting a second conductivity imparting dopant into a first region, and into a second region, of said silicon on insulator layer, not covered by said first polysilicon gate structure, and not covered by said field oxide region, to be used for a first type transistor structure;

ion implanting said second conductivity imparting dopant into a third region of said silicon on insulator layer, not covered by said second polysilicon gate structure, and not covered by said field oxide region, to be used for a second type transistor structure;

forming a first photoresist shape, exposing said first region, of said silicon on insulator layer;

ion implanting a third conductivity imparting dopant into exposed said first region, of said silicon on insulator layer, not covered by said first polysilicon gate structure, and not covered by said field oxide region, to be used for said first type transistor structure;

removal of said first photoresist shape;

deposition of a second insulator layer;

anisotropic etching of said second insulator layer to form insulator sidewall spacers on sides of said first and second polysilicon gate structures;

forming a second photoresist shape, exposing said first region, and said second region of said silicon on insulator layer, to be used for said first type transistor structure;

ion implanting a fourth conductivity imparting dopant into exposed said first region, of said silicon on insulator layer, not covered by said field oxide region, not covered by said first polysilicon gate structure, and not covered by insulator sidewall spacers region;

ion implanting said fourth conductivity imparting dopant into exposed said second region, of said silicon on insulator layer, not covered by said second polysilicon gate structure, not covered by said field oxide region, and not covered by said insulator sidewall spacers;

removal of said second photoresist shape;

forming a third photoresist shape, exposing said third region, of said silicon on insulator layer, to be used for said second type transistor structure, and exposing an area of said second region, of said silicon on insulator layer, not previously subjected to ion implantation of fourth conductivity imparting dopant, to be used for said first type transistor structure;

ion implanting a fifth conductivity imparting dopant into said third region, of said silicon on insulator layer, not covered by said field oxide regions, not covered by said second polysilicon gate structure, and not covered by said insulator sidewall spacers;

ion implanting said fifth conductivity imparting dopant into said area of said second region, of said silicon on insulator layer, not covered by said third photoresist shape;

removal of said third photoresist shape;

deposition of a third insulator layer;

opening contact holes in said third insulator layer, to said area of said second region, to said first region, and to said second region, of said silicon on insulator layer, to be used for said first type transistor structure, and to said third region of said silicon on insulator layer, to be used for said second type transistor structure;

deposition of a metal; and forming metal contact structures to said area of said second region, to said first region, and to said second region, of said silicon on insulator layer, to be used for said first type transistor structure, and forming contacts to said first and second polysilicon gate structures, and to said third region, of silicon on insulator layer, to be used for said second type transistor structure.

2. The method of claim 1, wherein said silicon on insulator layer is produced by the SIMOX process, resulting in a P type silicon layer, having a <100> crystallographic orientation, with a resistivity between about 15 to 25 ohm-cm, and a thickness between about 500 to 2000 Angstroms.

3. The method of claim 1, wherein said first insulator layer is silicon dioxide, thermally grown, in a oxygen-steam ambient, at a temperature between about 800° to 1000° C., to a thickness between about 40 to 200 Angstroms.

4. The method of claim 1, wherein said polysilicon layer is deposited intrinsically, using LPCVD processing, at a temperature between about 500° to 650° C., to a thickness between about 1200 to 3000 Angstroms.

5. The method of claim 1, wherein said first conductivity imparting dopant is phosphorous, ion implanted at an energy between about 50 to 100 Kev., at a dose between about 1E14 to 1E16 atoms/cm$^2$.

6. The method of claim 1, wherein said second conductivity imparting dopant is boron, ion implanted at an energy between about 30 to 80 Kev., at a dose between about 1E12 to 1E14 atoms/cm$^2$.

7. The method of claim 1, wherein said third conductivity imparting dopant is arsenic, ion implanted at an energy between about 25 to 40 Kev., at a dose between about 5E14 to 5E15 atoms/cm$^2$.

8. The method of claim 1, wherein said second insulator layer is silicon oxide, deposited using either LPCVD or PECVD processing, at a temperature between about 600° to 800° C., to thickness between about 800 to 2500 Angstroms.

9. The method of claim 1, wherein said insulator sidewall spacer is formed by anisotropic RIE processing, using CHF$_3$ as an etchant.

10. The method of claim 1, wherein said fourth conductivity imparting dopant is arsenic, ion implanted at an energy between about 30 to 80 Kev., at a dose between about 5E14 to 5E15 atoms/cm$^2$.

11. The method of claim 1, wherein said fifth conductivity imparting dopant is boron, ion implanted at an energy between about 30 to 80 Kev., at a dose between about 1E14 to 5E15 atoms/cm$^2$.

12. A method for a fabricating lateral, NPN bipolar junction transistor, and a P channel MOSFET device, in a layer of silicon on insulator, on a semiconductor substrate, comprising the steps of:

providing said semiconductor substrate;

providing said silicon on insulator layer, on said semiconductor substrate;

growing field oxide regions on specific areas of said silicon on insulator layer;

growing a first insulator layer on surface of said silicon on insulator layer, not covered by said field oxide regions;

depositing a polysilicon layer on said first insulator layer and on said field oxide regions;

ion implanting a first conductivity imparting dopant into said polysilicon layer;

patterning of said polysilicon layer to form a polysilicon gate structure;

ion implanting a second conductivity imparting dopant into a first region, and into a second region of said silicon on insulator layer, not covered by said polysilicon gate structure, and not covered by said field oxide regions, to create an initial base region of said lateral, NPN bipolar junction transistor;

ion implanting said second conductivity imparting dopant into a third region of said silicon on insulator layer, to create a lightly doped source and drain region, for said P channel MOSFET device;

forming a first photoresist shape, exposing said first region of said silicon on insulator layer;

ion implanting a third conductivity imparting dopant into said first region of said silicon on insulator layer, not covered by said field oxide regions, and not covered by said polysilicon gate structure, to convert said initial base region, of said first region, to a collector region, for said lateral, NPN bipolar junction transistor;

removal of said first photoresist shape;

deposition of a second insulator layer;

anisotropic etching of said second insulator layer to form insulator sidewall spacers on sides of said polysilicon gate structure;

forming a second photoresist shape, exposing said first region, and said second region of said silicon on insulator layer;

ion implanting a fourth conductivity imparting dopant into said first region of said silicon on insulator layer, not covered by said field oxide regions, not covered by said polysilicon gate structure, and not covered by said insulator sidewall spacers, to increase the dopant level of said collector region, of said lateral, NPN bipolar junction transistor;

ion implanting said fourth conductivity imparting dopant into said second region of said silicon on insulator layer, not covered by said field oxide region, not covered by said polysilicon gate structure, and not covered by said insulator sidewall spacers, to convert said initial base region to an emitter region of said lateral, NPN bipolar junction transistor, and creating a narrow base region, directly under one of said insulator sidewall spacers;

removal of said second photoresist shape;

forming a third photoresist shape, exposing a third region of said silicon on insulator layer, to be used for said P channel MOSFET device, and exposing regions of said initial base region, of said lateral, NPN bipolar junction transistor;

ion implanting a fifth conductivity imparting dopant into said third region of said silicon on insulator layer, not covered by said field oxide regions, not covered by said polysilicon gate structure, and not covered by said insulator sidewall spacer, to form heavily doped source and drain regions of said P channel MOSFET device;

ion implanting said fifth conductivity imparting dopant into regions of said initial base region, of said lateral, NPN bipolar junction transistor, not covered by said third photoresist shape, to form a heavily doped base contact region;

removal of said third photoresist shape deposition of a third insulator layer;

opening contact holes to said emitter region, to said heavily doped base contact region, and to collector region, of said lateral, NPN bipolar junction transistor, and opening contact holes to said heavily doped source and drain regions, and to said polysilicon gate structure, of said P channel MOSFET device;

deposition of a metal; and forming metal contact structures to said emitter region, to said heavily doped base contact region, and to said collector region, of said lateral, NPN bipolar junction transistor, and to said heavily doped source and drain regions, and to said polysilicon gate structure, of said P channel MOSFET device.

13. The method of claim 12, wherein said silicon on insulator layer is obtained via the SIMOX process, resulting in a P type silicon layer, having an <100> crystallographic orientation, with a resistivity between about 15 to 25 ohm-cm, and a thickness between about 500 to 2000 Angstroms.

14. The method of claim 12, wherein said first insulator layer is silicon dioxide, thermally grown in an oxygen-steam ambient, at a temperature between about 800° to 1000° C., to a thickness between about 40 to 200 Angstroms.

15. The method of claim 12, wherein said polysilicon layer is deposited using LPCVD processing, at a temperature between about 500° to 650° C., to a thickness between about 1200 to 3000 Angstroms.

16. The method of claim 12, wherein said first conductivity imparting dopant is phosphorous, ion implanted at an energy between about 50 to 100 Kev., at a dose between about 1E14 to 1E16 atoms/cm$^2$.

17. The method of claim 12, wherein said second conductivity imparting dopant, used to form said initial base region of said lateral bipolar junction transistor, and said lightly doped source and drain region for said P channel MOSFET device, is boron, ion implanted at an energy between about 30 to 80 Kev., at a dose between about 1E12 to 1E14 atoms/cm$^2$.

18. The method of claim 12, wherein said third conductivity imparting dopant, used to form said collector region of said lateral, NPN bipolar junction transistor, is arsenic, ion implanted at an energy between about 25 to 40 Kev., at a dose between about 5E14 to 5E15 atoms/cm$^2$.

19. The method of claim 12, wherein said second insulator layer is silicon oxide, deposited using either LPCVD or PECVD processing, at a temperature between about 600° to 800° C., to thickness between about 800 to 2500 Angstrom.

20. The method of claim 12, wherein said insulator sidewall spacer is formed via anisotropic, reactive ion etching, using $CHF_3$ as an etchant.

21. The method of claim 12, wherein said fourth conductivity imparting dopant, used to form said emitter region, used to form said heavily doped collector region, and used to create said narrow base region, under said insulator sidewall spacer, of said lateral, NPN bipolar junction transistor, is arsenic, ion implanted at an energy between about 30 to 80 Kev., at a dose between about 5E14 to 5E15 atoms/cm$^2$.

22. The method of claim 12, wherein said fifth conductivity imparting dopant, used to form said heavily doped source and drain regions, of said P channel MOSFET device, is boron, ion implanted at an energy between about 30 to 80 Kev., at a dose between about 1E14 to 5E15 atoms/cm$^2$.

* * * * *